(12) United States Patent
Tipirneni et al.

(10) Patent No.: US 10,229,988 B2
(45) Date of Patent: Mar. 12, 2019

(54) ADAPTIVE CHARGE BALANCED EDGE TERMINATION

(71) Applicant: Vishay-Siliconix, Santa Clara, CA (US)

(72) Inventors: Naveen Tipirneni, Santa Clara, CA (US); Deva N. Pattanayak, Saratoga, CA (US)

(73) Assignee: Vishay-Siliconix, San Jose, CA (US)

( * ) Notice: Subject to any disclaimer, the term of this patent is extended or adjusted under 35 U.S.C. 154(b) by 0 days.

(21) Appl. No.: 15/838,165

(22) Filed: Dec. 11, 2017

(65) Prior Publication Data

US 2018/0114852 A1 Apr. 26, 2018

Related U.S. Application Data

(62) Division of application No. 13/484,114, filed on May 30, 2012, now Pat. No. 9,842,911.

(51) Int. Cl.
*H01L 31/119* (2006.01)
*H01L 29/66* (2006.01)
(Continued)

(52) U.S. Cl.
CPC ...... *H01L 29/66712* (2013.01); *H01L 21/266* (2013.01); *H01L 29/0615* (2013.01);
(Continued)

(58) Field of Classification Search
CPC .................. H01L 21/266; H01L 29/0615; H01L 29/0619
See application file for complete search history.

(56) References Cited

U.S. PATENT DOCUMENTS 4,191,603 A 3/1980 Garbarino et al.
4,375,999 A 3/1983 Nawata et al.
(Continued)

FOREIGN PATENT DOCUMENTS

CN 101154664 4/2008
CN 101154664 A 4/2008
(Continued)

OTHER PUBLICATIONS

"Effects on Selecting Channel Direction in Improving Performance of Sub-100 nm MOSFETs Fabricated on (110) Surface Si Substrate" "Japanese Journal of Applied Physics, Part 1, vol. 43, No. 4B, Apr. 2004 pp. 1723-1728 (Nakamura et al.), XP00122768."
(Continued)

*Primary Examiner* — Samuel Gebremariam

(57) ABSTRACT

In one embodiment, a semiconductor device can include a substrate including a first type dopant. The semiconductor device can also include an epitaxial layer located above the substrate and including a lower concentration of the first type dopant than the substrate. In addition, the semiconductor device can include a junction extension region located within the epitaxial layer and including a second type dopant. Furthermore, the semiconductor device can include a set of field rings in physical contact with the junction extension region and including a higher concentration of the second type dopant than the junction extension region. Moreover, the semiconductor device can include an edge termination structure in physical contact with the set of field rings.

20 Claims, 10 Drawing Sheets

(51) Int. Cl.
  *H01L 21/266* (2006.01)
  *H01L 29/40* (2006.01)
  *H01L 29/78* (2006.01)
  *H01L 29/06* (2006.01)
  *H01L 29/10* (2006.01)

(52) U.S. Cl.
  CPC ...... *H01L 29/0619* (2013.01); *H01L 29/1095* (2013.01); *H01L 29/404* (2013.01); *H01L 29/7811* (2013.01)

(56) References Cited

U.S. PATENT DOCUMENTS

| | | | |
|---|---|---|---|
| 4,399,449 A | 8/1983 | Herman et al. |
| 4,532,534 A | 7/1985 | Ford et al. |
| 4,584,025 A | 4/1986 | Takaoka et al. |
| 4,593,302 A | 6/1986 | Lidow et al. |
| 4,602,266 A | 7/1986 | Coe |
| 4,620,211 A | 10/1986 | Baliga et al. |
| 4,641,174 A | 2/1987 | Baliga |
| 4,646,117 A | 2/1987 | Temple |
| 4,672,407 A | 6/1987 | Nakagawa et al. |
| 4,680,853 A | 7/1987 | Lidow et al. |
| 4,710,265 A | 12/1987 | Hotta |
| 4,782,372 A | 11/1988 | Nakagawa et al. |
| 4,799,095 A | 1/1989 | Baliga |
| 4,803,532 A | 2/1989 | Mihara |
| 4,819,044 A | 4/1989 | Murakami |
| 4,819,052 A | 4/1989 | Hutter |
| 4,823,172 A | 4/1989 | Mihara |
| 4,827,321 A | 5/1989 | Baliga |
| 4,857,986 A | 8/1989 | Kinugawa |
| 4,893,160 A | 1/1990 | Blanchard |
| 4,928,155 A | 5/1990 | Nakagawa et al. |
| 4,939,557 A | 7/1990 | Pao et al. |
| 4,941,026 A | 7/1990 | Temple |
| 4,954,854 A | 9/1990 | Dhong et al. |
| 4,967,243 A | 10/1990 | Baliga et al. |
| 4,969,027 A | 11/1990 | Baliga et al. |
| 4,974,059 A | 11/1990 | Kinzer |
| 4,982,249 A | 1/1991 | Kim et al. |
| 5,016,066 A | 5/1991 | Takahashi |
| 5,019,526 A | 5/1991 | Yamane et al. |
| 5,021,840 A | 6/1991 | Morris |
| 5,034,338 A | 7/1991 | Neppl et al. |
| 5,034,346 A | 7/1991 | Alter et al. |
| 5,072,266 A | 12/1991 | Bulucea et al. |
| 5,086,007 A | 2/1992 | Ueno |
| 5,087,577 A | 2/1992 | Strack |
| 5,111,253 A | 5/1992 | Korman et al. |
| 5,113,237 A | 5/1992 | Stengl |
| 5,155,574 A | 10/1992 | Yamaguchi |
| 5,156,993 A | 10/1992 | Su |
| 5,160,491 A | 11/1992 | Mori |
| 5,168,331 A | 12/1992 | Yilmaz |
| 5,171,699 A | 12/1992 | Hutter et al. |
| 5,191,395 A | 3/1993 | Nishimura |
| 5,221,850 A | 6/1993 | Sakurai |
| 5,233,215 A | 8/1993 | Baliga |
| 5,245,106 A | 9/1993 | Cameron et al. |
| 5,250,449 A | 10/1993 | Kuroyanagi et al. |
| 5,268,586 A | 12/1993 | Mukherjee et al. |
| 5,298,442 A | 3/1994 | Bulucea et al. |
| 5,316,959 A | 5/1994 | Kwan et al. |
| 5,341,011 A | 8/1994 | Hshieh et al. |
| 5,362,665 A | 11/1994 | Lu |
| 5,366,914 A | 11/1994 | Takahashi et al. |
| 5,378,655 A | 1/1995 | Hutchings et al. |
| 5,387,528 A | 2/1995 | Hutchings et al. |
| 5,396,085 A | 3/1995 | Baliga |
| 5,404,040 A | 4/1995 | Hshieh et al. |
| 5,422,508 A | 6/1995 | Yilmaz et al. |
| 5,429,964 A | 7/1995 | Yilmaz et al. |
| 5,430,315 A | 7/1995 | Rumennik |
| 5,497,013 A | 3/1996 | Temple |
| 5,521,409 A | 5/1996 | Hshieh et al. |
| 5,525,821 A | 6/1996 | Harada et al. |
| 5,527,720 A | 6/1996 | Goodyear et al. |
| 5,567,634 A | 10/1996 | Hebert et al. |
| 5,578,508 A | 11/1996 | Baba et al. |
| 5,597,765 A | 1/1997 | Yilmaz et al. |
| 5,602,424 A | 2/1997 | Tsubouchi et al. |
| 5,614,751 A | 3/1997 | Yilmaz et al. |
| 5,621,234 A | 4/1997 | Kato |
| 5,648,283 A | 7/1997 | Tsang et al. |
| 5,689,128 A | 11/1997 | Hshieh et al. |
| 5,696,396 A | 12/1997 | Tokura et al. |
| 5,770,878 A | 6/1998 | Beasom |
| 5,808,340 A | 9/1998 | Wollesen et al. |
| 5,814,858 A | 9/1998 | Williams |
| 5,877,538 A | 3/1999 | Williams |
| 5,965,904 A | 10/1999 | Ohtani et al. |
| 5,998,836 A | 12/1999 | Williams |
| 5,998,837 A | 12/1999 | Williams |
| 6,049,108 A | 4/2000 | Williams et al. |
| 6,096,584 A | 8/2000 | Ellis-Monaghan et al. |
| 6,140,678 A | 10/2000 | Grabowski et al. |
| 6,153,896 A | 11/2000 | Omura et al. |
| 6,168,996 B1 | 1/2001 | Numazawa et al. |
| 6,172,398 B1 | 1/2001 | Hshieh |
| 6,180,966 B1 | 1/2001 | Kohno et al. |
| 6,204,533 B1 | 3/2001 | Williams et al. |
| 6,211,018 B1 | 4/2001 | Nam et al. |
| 6,228,700 B1 | 5/2001 | Lee |
| 6,238,981 B1 | 5/2001 | Grebs |
| 6,245,615 B1 | 6/2001 | Noble et al. |
| 6,268,242 B1 | 7/2001 | Williams et al. |
| 6,274,904 B1 | 8/2001 | Tihanyi |
| 6,277,695 B1 | 8/2001 | Williams et al. |
| 6,285,060 B1 | 9/2001 | Korec et al. |
| 6,323,518 B1 | 11/2001 | Sakamoto et al. |
| 6,348,712 B1 | 2/2002 | Korec et al. |
| 6,351,009 B1 | 2/2002 | Kocon et al. |
| 6,359,308 B1 | 3/2002 | Hijzen et al. |
| 6,380,569 B1 | 4/2002 | Chang et al. |
| 6,391,721 B2 | 5/2002 | Nakagawa |
| 6,413,822 B2 | 7/2002 | Williams et al. |
| 6,465,843 B1 | 10/2002 | Hirler et al. |
| 6,483,171 B1 | 11/2002 | Forbes et al. |
| 6,489,204 B1 | 12/2002 | Tsui |
| 6,495,883 B2 | 12/2002 | Shibata et al. |
| 6,498,071 B2 | 12/2002 | Hijzen et al. |
| 6,580,123 B2 | 6/2003 | Thapar |
| 6,580,154 B2 | 6/2003 | Noble et al. |
| 6,620,691 B2 | 9/2003 | Hshieh et al. |
| 6,621,122 B2 | 9/2003 | Qu |
| 6,642,109 B2 | 11/2003 | Lee et al. |
| 6,661,054 B1 | 12/2003 | Nakamura |
| 6,700,158 B1 | 3/2004 | Cao et al. |
| 6,710,403 B2 | 3/2004 | Sapp |
| 6,717,210 B2 | 4/2004 | Takano et al. |
| 6,756,274 B2 | 6/2004 | Williams et al. |
| 6,764,889 B2 | 7/2004 | Baliga |
| 6,770,539 B2 | 8/2004 | Sumida |
| 6,794,239 B2 | 9/2004 | Gonzalez |
| 6,825,105 B2 | 11/2004 | Grover et al. |
| 6,831,345 B2 | 12/2004 | Kinoshita et al. |
| 6,836,001 B2 | 12/2004 | Yamauchi et al. |
| 6,861,701 B2 | 3/2005 | Williams et al. |
| 6,903,393 B2 | 6/2005 | Ohmi et al. |
| 6,919,610 B2 | 7/2005 | Saitoh et al. |
| 6,927,451 B1 | 8/2005 | Darwish |
| 6,927,455 B2 | 8/2005 | Narazaki |
| 6,960,821 B2 | 11/2005 | Noble et al. |
| 6,987,305 B2 | 1/2006 | He et al. |
| 7,045,857 B2 | 5/2006 | Darwish et al. |
| 7,122,875 B2 | 10/2006 | Hatade |
| 7,161,209 B2 | 1/2007 | Saito et al. |
| 7,224,022 B2 | 5/2007 | Tokano et al. |
| 7,319,256 B1 | 1/2008 | Kraft et al. |
| 7,335,946 B1 | 2/2008 | Bhalla et al. |
| 7,348,235 B2 | 3/2008 | Fujiishi |
| 7,361,952 B2 | 4/2008 | Miura et al. |
| 7,375,029 B2 | 5/2008 | Poelzl |

(56) References Cited

U.S. PATENT DOCUMENTS

| | | |
|---|---|---|
| 7,397,083 B2 | 7/2008 | Amali et al. |
| 7,449,354 B2 | 11/2008 | Marchant et al. |
| 7,470,953 B2 | 12/2008 | Takaya et al. |
| 7,504,307 B2 | 3/2009 | Peake |
| 7,521,306 B2 | 4/2009 | Kubo et al. |
| 7,541,642 B2 | 6/2009 | Kawamura et al. |
| 7,544,568 B2 | 6/2009 | Matsuura et al. |
| 7,601,603 B2 | 10/2009 | Yamauchi et al. |
| 7,642,178 B2 | 1/2010 | Yamauchi et al. |
| 7,659,588 B2 | 2/2010 | Husain et al. |
| 7,663,195 B2 | 2/2010 | Ohmi et al. |
| 7,700,970 B2 | 4/2010 | Saggio et al. |
| 7,704,864 B2 | 4/2010 | Hshieh |
| 7,745,883 B2 | 6/2010 | Williams et al. |
| 7,767,500 B2 | 8/2010 | Sridevan |
| 7,811,907 B2 | 10/2010 | Shibata et al. |
| 7,825,474 B2 | 11/2010 | Noguchi et al. |
| 7,834,376 B2 | 11/2010 | Carta et al. |
| 7,910,440 B2 | 3/2011 | Ohta et al. |
| 7,910,486 B2 | 3/2011 | Yilmaz et al. |
| 7,911,020 B2 | 3/2011 | Niimura et al. |
| 7,964,913 B2 | 6/2011 | Darwish |
| 8,076,718 B2 | 12/2011 | Takaya et al. |
| 8,080,459 B2 | 12/2011 | Xu |
| 8,247,296 B2 | 8/2012 | Grivna |
| 8,334,566 B2 | 12/2012 | Tai |
| 8,367,500 B1 | 2/2013 | Xu et al. |
| 8,368,165 B2 | 2/2013 | Richieri |
| 8,536,003 B2 | 9/2013 | Lin et al. |
| 8,536,004 B2 | 9/2013 | Lin et al. |
| 8,541,278 B2 | 9/2013 | Lin et al. |
| 8,541,834 B2 | 9/2013 | Nozu |
| 8,558,309 B2 | 10/2013 | Tamaki et al. |
| 8,564,088 B2 | 10/2013 | Schmidt |
| 8,575,707 B2 | 11/2013 | Tamaki et al. |
| 8,598,657 B2 | 12/2013 | Tamaki et al. |
| 8,603,879 B2 | 12/2013 | Lin et al. |
| 8,629,019 B2 | 1/2014 | Xu et al. |
| 8,633,561 B2 | 1/2014 | Husain et al. |
| 8,643,056 B2 | 2/2014 | Kimura et al. |
| 8,643,089 B2 | 2/2014 | Lee et al. |
| 8,669,614 B2 | 3/2014 | Cheng |
| 8,716,789 B2 | 5/2014 | Ono et al. |
| 8,748,973 B2 | 6/2014 | Lin et al. |
| 8,749,017 B2 | 6/2014 | Lu |
| 8,772,869 B2 | 7/2014 | Saito et al. |
| 8,786,046 B2 | 7/2014 | Tamaki et al. |
| 8,790,971 B1 | 7/2014 | Lin et al. |
| 8,796,787 B2 | 8/2014 | Tamaki et al. |
| 8,803,207 B2 | 8/2014 | Grebs et al. |
| 8,836,017 B2 | 9/2014 | Lee et al. |
| 8,847,305 B2 | 9/2014 | Toyoda et al. |
| 8,860,144 B2 | 10/2014 | Ohta et al. |
| 8,940,606 B2 | 1/2015 | Lin et al. |
| 8,963,260 B2 | 2/2015 | Lin et al. |
| 8,981,469 B2 | 3/2015 | Tamaki et al. |
| 8,987,819 B2 | 3/2015 | Tamaki et al. |
| 9,000,516 B2 | 4/2015 | Xiao |
| 9,006,822 B2 | 4/2015 | Peake et al. |
| 9,041,070 B2 | 5/2015 | Eguchi et al. |
| 9,041,101 B2 | 5/2015 | Ono et al. |
| 9,048,250 B2 | 6/2015 | Yamada et al. |
| 9,076,725 B2 | 7/2015 | Niimura |
| 9,076,887 B2 | 7/2015 | Lee et al. |
| 9,082,810 B2 | 7/2015 | Kitagawa |
| 9,093,288 B2 | 7/2015 | Tamaki et al. |
| 9,111,770 B2 | 8/2015 | Lin et al. |
| 9,129,892 B2 | 9/2015 | Toyoda et al. |
| 9,136,324 B2 | 9/2015 | Kimura et al. |
| 9,136,325 B2 | 9/2015 | Tan et al. |
| 9,166,036 B2 | 10/2015 | Tamaki |
| 9,236,460 B2 | 1/2016 | Koyama et al. |
| 9,240,464 B2 | 1/2016 | Eguchi et al. |
| 9,269,767 B2 | 2/2016 | Tamaki et al. |
| 9,281,393 B2 | 3/2016 | Ma et al. |
| 9,293,564 B2 | 3/2016 | Nishimura et al. |
| 9,306,064 B2 | 4/2016 | Wahl et al. |
| 9,312,332 B2 | 4/2016 | Lu |
| 9,349,721 B2 | 5/2016 | Saito et al. |
| 9,362,118 B2 | 6/2016 | Toyoda et al. |
| 9,368,617 B2 | 6/2016 | Hirler et al. |
| 9,379,235 B2 | 6/2016 | Tamaki et al. |
| 9,412,880 B2 | 8/2016 | Carta et al. |
| 9,419,092 B2 | 8/2016 | Carta et al. |
| 9,425,305 B2 | 8/2016 | Terrill et al. |
| 9,425,306 B2 | 8/2016 | Gao et al. |
| 9,431,249 B2 | 8/2016 | Pattanayak |
| 9,431,290 B2 | 8/2016 | Niimura |
| 9,431,550 B2 | 8/2016 | Chen et al. |
| 9,437,424 B2 | 9/2016 | Pattanayak et al. |
| 9,443,974 B2 | 9/2016 | Gao et al. |
| 9,478,441 B1 | 10/2016 | Sridevan |
| 9,842,911 B2 * | 12/2017 | Tipirneni .......... H01L 29/66712 |
| 2001/0005031 A1 | 6/2001 | Sakamoto et al. |
| 2001/0026006 A1 | 10/2001 | Noble et al. |
| 2001/0026989 A1 | 10/2001 | Thapar |
| 2001/0050394 A1 | 12/2001 | Onishi et al. |
| 2001/0052601 A1 | 12/2001 | Onishi et al. |
| 2002/0016034 A1 | 2/2002 | Gonzalez |
| 2002/0030237 A1 | 3/2002 | Omura et al. |
| 2002/0036319 A1 | 3/2002 | Baliga |
| 2002/0038887 A1 | 4/2002 | Ninomiya et al. |
| 2002/0050847 A1 | 5/2002 | Taniguchi et al. |
| 2002/0074585 A1 | 6/2002 | Tsang et al. |
| 2002/0123196 A1 | 9/2002 | Chang et al. |
| 2002/0130359 A1 | 9/2002 | Okumura et al. |
| 2003/0011046 A1 | 1/2003 | Qu |
| 2003/0030092 A1 | 2/2003 | Darwish et al. |
| 2003/0067033 A1 | 4/2003 | Kinoshita et al. |
| 2003/0085422 A1 | 5/2003 | Amali et al. |
| 2003/0193067 A1 | 10/2003 | Kim et al. |
| 2003/0201483 A1 | 10/2003 | Sumida |
| 2004/0016959 A1 | 1/2004 | Yamaguchi et al. |
| 2004/0021173 A1 | 2/2004 | Sapp |
| 2004/0021174 A1 | 2/2004 | Kobayashi |
| 2004/0056284 A1 | 3/2004 | Nagaoka et al. |
| 2004/0113201 A1 | 6/2004 | Bhalla et al. |
| 2004/0155287 A1 | 8/2004 | Omura et al. |
| 2004/0161886 A1 | 8/2004 | Forbes et al. |
| 2004/0173844 A1 | 9/2004 | Williams et al. |
| 2004/0222458 A1 | 11/2004 | Hsieh et al. |
| 2004/0222461 A1 | 11/2004 | Peyre-Lavigne et al. |
| 2005/0001268 A1 | 1/2005 | Baliga |
| 2005/0026369 A1 | 2/2005 | Noble et al. |
| 2005/0029585 A1 | 2/2005 | He et al. |
| 2005/0079678 A1 | 4/2005 | Verma et al. |
| 2005/0167695 A1 | 8/2005 | Yilmaz |
| 2005/0184336 A1 | 8/2005 | Takahashi et al. |
| 2005/0215011 A1 | 9/2005 | Darwish et al. |
| 2005/0266642 A1 | 12/2005 | Kubo et al. |
| 2006/0014349 A1 | 1/2006 | Williams et al. |
| 2006/0108635 A1 | 5/2006 | Bhalla et al. |
| 2006/0113577 A1 | 6/2006 | Ohtani |
| 2006/0113588 A1 | 6/2006 | Wu |
| 2006/0209887 A1 | 9/2006 | Bhalla et al. |
| 2006/0214221 A1 | 9/2006 | Challa et al. |
| 2006/0214242 A1 | 9/2006 | Carta et al. |
| 2006/0226494 A1 | 10/2006 | Hshieh |
| 2006/0267090 A1 | 11/2006 | Sapp et al. |
| 2006/0273383 A1 | 12/2006 | Hshieh |
| 2006/0273390 A1 | 12/2006 | Hshieh et al. |
| 2006/0285368 A1 | 12/2006 | Schlecht |
| 2007/0007589 A1 | 1/2007 | Nakagawa |
| 2007/0013000 A1 | 1/2007 | Shiraishi |
| 2007/0023828 A1 | 2/2007 | Kawamura et al. |
| 2007/0040217 A1 | 2/2007 | Saito et al. |
| 2007/0048909 A1 | 3/2007 | Sridevan |
| 2007/0138546 A1 | 6/2007 | Kawamura et al. |
| 2007/0145514 A1 | 6/2007 | Kocon |
| 2007/0155104 A1 | 7/2007 | Marchant et al. |
| 2007/0228496 A1 | 10/2007 | Rochefort et al. |
| 2007/0249142 A1 | 10/2007 | Hisanaga |
| 2007/0272977 A1 | 11/2007 | Saito et al. |
| 2007/0290257 A1 | 12/2007 | Kraft et al. |

(56) References Cited

U.S. PATENT DOCUMENTS

| | | |
|---|---|---|
| 2008/0042172 A1 | 2/2008 | Hirler et al. |
| 2008/0079078 A1 | 4/2008 | Noguchi et al. |
| 2008/0090347 A1 | 4/2008 | Huang et al. |
| 2008/0099344 A9 | 5/2008 | Basol et al. |
| 2008/0135931 A1 | 6/2008 | Challa et al. |
| 2008/0164517 A1 | 7/2008 | Ohta et al. |
| 2008/0173969 A1 | 7/2008 | Hebert et al. |
| 2008/0185640 A1 | 8/2008 | Nakagawa |
| 2008/0185643 A1 | 8/2008 | Hossain |
| 2008/0197407 A1 | 8/2008 | Challa et al. |
| 2008/0164515 A1 | 9/2008 | Li |
| 2008/0211020 A1 | 9/2008 | Saito |
| 2008/0246081 A1 | 10/2008 | Li et al. |
| 2008/0290403 A1 | 11/2008 | Ono et al. |
| 2009/0020810 A1 | 1/2009 | Marchant |
| 2009/0079002 A1 | 3/2009 | Lee et al. |
| 2009/0085099 A1 | 4/2009 | Su et al. |
| 2009/0090967 A1 | 4/2009 | Chen et al. |
| 2009/0140327 A1 | 6/2009 | Hirao et al. |
| 2009/0159963 A1 | 6/2009 | Yamaguchi et al. |
| 2009/0166721 A1 | 7/2009 | Denison et al. |
| 2009/0166740 A1 | 7/2009 | Bhalla et al. |
| 2009/0206440 A1 | 8/2009 | Schulze et al. |
| 2009/0302376 A1 | 12/2009 | Inoue et al. |
| 2009/0315104 A1 | 12/2009 | Hsieh |
| 2010/0006935 A1 | 1/2010 | Huang et al. |
| 2010/0032791 A1 | 2/2010 | Hozumi et al. |
| 2010/0055892 A1 | 3/2010 | Poelzl |
| 2010/0059797 A1 | 3/2010 | Ngai et al. |
| 2010/0078775 A1 | 4/2010 | Mauder et al. |
| 2010/0181606 A1 | 7/2010 | Takaishi |
| 2010/0233667 A1 | 9/2010 | Wilson et al. |
| 2010/0289032 A1 | 11/2010 | Zhang et al. |
| 2010/0311216 A1 | 12/2010 | Marchant |
| 2011/0001189 A1 | 1/2011 | Challa et al. |
| 2011/0049614 A1 | 3/2011 | Gao et al. |
| 2011/0053326 A1 | 3/2011 | Gao et al. |
| 2011/0089486 A1 | 4/2011 | Xu et al. |
| 2011/0089488 A1 | 4/2011 | Yilmaz et al. |
| 2011/0233667 A1 | 9/2011 | Tai et al. |
| 2011/0233714 A1 | 9/2011 | Lu |
| 2011/0241104 A1 | 10/2011 | Willmeroth et al. |
| 2011/0254084 A1 | 10/2011 | Terrill et al. |
| 2012/0112306 A1 | 5/2012 | Onishi |
| 2012/0187474 A1 | 7/2012 | Rexer et al. |
| 2012/0187477 A1 | 7/2012 | Hsieh |
| 2012/0241847 A1 | 9/2012 | Saito et al. |
| 2012/0273871 A1 | 11/2012 | Yedinak et al. |
| 2012/0273875 A1 | 11/2012 | Yedinak et al. |
| 2012/0273884 A1 | 11/2012 | Yedinak et al. |
| 2012/0299094 A1 | 11/2012 | Lee et al. |
| 2012/0313161 A1 | 12/2012 | Grivna et al. |
| 2012/0326229 A1 | 12/2012 | Poelzl et al. |
| 2013/0069145 A1 | 3/2013 | Kawano et al. |
| 2013/0134500 A1 | 5/2013 | Tamaki et al. |
| 2013/0140633 A1 | 6/2013 | Pattanayak |
| 2013/0187196 A1 | 7/2013 | Kadow |
| 2013/0207227 A1 | 8/2013 | Azam et al. |
| 2013/0214355 A1 | 8/2013 | Fang et al. |
| 2013/0264650 A1 | 10/2013 | Tamaki et al. |
| 2013/0277763 A1 | 10/2013 | Ohta et al. |
| 2013/0334598 A1 | 12/2013 | Okumura |
| 2014/0027842 A1 | 1/2014 | Tamaki et al. |
| 2014/0027847 A1 | 1/2014 | Tamaki et al. |
| 2014/0035002 A1 | 2/2014 | Cao et al. |
| 2014/0061644 A1 | 3/2014 | Cao et al. |
| 2014/0061783 A1 | 3/2014 | Xiao |
| 2014/0110779 A1 | 4/2014 | Tamaki |
| 2014/0117445 A1 | 5/2014 | Kimura et al. |
| 2014/0159143 A1 | 6/2014 | Ma et al. |
| 2014/0191309 A1 | 7/2014 | Eguchi et al. |
| 2014/0191310 A1 | 7/2014 | Ono et al. |
| 2014/0199816 A1 | 7/2014 | Lin et al. |
| 2014/0206162 A1 | 7/2014 | Eguchi et al. |
| 2014/0242769 A1 | 8/2014 | Yamada et al. |
| 2014/0284704 A1 | 9/2014 | Saito et al. |
| 2014/0291773 A1 | 10/2014 | Lin et al. |
| 2014/0299961 A1 | 10/2014 | Tamaki et al. |
| 2014/0302621 A1 | 10/2014 | Niimura |
| 2014/0312418 A1 | 10/2014 | Tamaki et al. |
| 2014/0327039 A1 | 11/2014 | Lin et al. |
| 2014/0370674 A1 | 12/2014 | Toyoda et al. |
| 2015/0054062 A1 | 2/2015 | Lin et al. |
| 2015/0054119 A1 | 2/2015 | Tan et al. |
| 2015/0076599 A1 | 3/2015 | Cho et al. |
| 2015/0097237 A1 | 4/2015 | Tamaki et al. |
| 2015/0115286 A1 | 4/2015 | Takeuchi et al. |
| 2015/0115355 A1 | 4/2015 | Hirler et al. |
| 2015/0115358 A1 | 4/2015 | Mauder et al. |
| 2015/0116031 A1 | 4/2015 | Wahl et al. |
| 2015/0137697 A1 | 5/2015 | Cheng |
| 2015/0155378 A1 | 6/2015 | Tamaki et al. |
| 2015/0179764 A1 | 6/2015 | Okumura |
| 2015/0187913 A1 | 7/2015 | Peake et al. |
| 2015/0249124 A1 | 9/2015 | Ma et al. |
| 2015/0270157 A1 | 9/2015 | Niimura |
| 2015/0287778 A1 | 10/2015 | Tamaki et al. |
| 2015/0340231 A1 | 11/2015 | Toyoda et al. |
| 2015/0364577 A1 | 12/2015 | Nishimura et al. |
| 2015/0372078 A1 | 12/2015 | Pattanayak et al. |
| 2016/0020273 A1 | 1/2016 | Woo et al. |
| 2016/0020276 A1 | 1/2016 | Lu |
| 2016/0020315 A1 | 1/2016 | Hirler |
| 2016/0035880 A1 | 2/2016 | Tamaki |
| 2016/0049466 A1 | 2/2016 | Abiko et al. |
| 2016/0079079 A1 | 3/2016 | Eguchi et al. |
| 2016/0079411 A1 | 3/2016 | Hino et al. |
| 2016/0126345 A1 | 5/2016 | Tamaki et al. |
| 2016/0133505 A1 | 5/2016 | Eguchi et al. |
| 2016/0190235 A1 | 6/2016 | Tamaki et al. |
| 2016/0225893 A1 | 8/2016 | Hirler et al. |

FOREIGN PATENT DOCUMENTS

| | | |
|---|---|---|
| CN | 101180737 A | 5/2008 |
| CN | 102194701 A | 9/2011 |
| DE | 3 932 621 | 4/1990 |
| DE | 4208695 A1 | 9/1992 |
| DE | 102004036330 A1 | 3/2005 |
| DE | 10343084 | 5/2005 |
| DE | 10 2004 057 792 | 6/2006 |
| DE | 112005003584 T5 | 4/2008 |
| DE | 112006003618 T5 | 11/2008 |
| DE | 10 2008 032 711 | 1/2009 |
| DE | 10 2009 036 930 | 3/2010 |
| EP | 0133642 A1 | 3/1985 |
| EP | 0227894 | 7/1987 |
| EP | 0279403 A2 | 8/1988 |
| EP | 0310047 A2 | 4/1989 |
| EP | 0 345 380 | 12/1989 |
| EP | 0354449 A2 | 2/1990 |
| EP | 0438700 A1 | 7/1991 |
| EP | 0 580 213 | 1/1994 |
| EP | 0 583 023 | 2/1994 |
| EP | 0583022 A2 | 2/1994 |
| EP | 0 620 588 | 10/1994 |
| EP | 0628337 A1 | 12/1994 |
| EP | 0746030 A2 | 12/1996 |
| EP | 1033759 A2 | 9/2000 |
| FR | 2 647 596 | 11/1990 |
| GB | 2033658 | 5/1980 |
| GB | 2087648 | 5/1982 |
| GB | 2134705 | 8/1984 |
| GB | 2137811 | 10/1984 |
| GB | 2166290 | 4/1986 |
| JP | 56-58267 | 5/1981 |
| JP | 59-84474 | 5/1984 |
| JP | 59-141267 | 8/1984 |
| JP | 60-249367 | 12/1985 |
| JP | 61-80860 | 4/1986 |
| JP | 62-176168 | 8/1987 |
| JP | 1-42177 | 2/1989 |
| JP | 1-198076 | 8/1989 |
| JP | 1-310576 | 12/1989 |

(56) References Cited

FOREIGN PATENT DOCUMENTS

| | | |
|---|---|---|
| JP | 2-91976 | 3/1990 |
| JP | H02-114646 | 4/1990 |
| JP | H03-270273 | 12/1991 |
| JP | 3273180 | 4/2002 |
| JP | 2002-127830 | 5/2002 |
| JP | 2002-540603 | 11/2002 |
| JP | 2003-101039 | 4/2003 |
| JP | 2003-179223 | 6/2003 |
| JP | 2005-209983 | 8/2005 |
| JP | 2005-286328 | 10/2005 |
| JP | 2006-005275 | 1/2006 |
| JP | 2006-128507 | 5/2006 |
| JP | 2006-310782 | 11/2006 |
| JP | 2007042836 | 2/2007 |
| JP | 2007-157799 | 6/2007 |
| JP | 2007-529115 | 10/2007 |
| JP | 2008-294214 | 12/2008 |
| JP | 2009-117715 | 5/2009 |
| JP | 2009-532880 | 9/2009 |
| JP | 2009-289904 | 12/2009 |
| JP | 2010-147065 | 7/2010 |
| JP | 2010-251404 | 11/2010 |
| JP | 2011-003729 | 1/2011 |
| JP | 2011-192824 | 9/2011 |
| JP | 2011-199223 | 10/2011 |
| JP | 2011-204710 | 10/2011 |
| JP | 2012-104577 | 5/2012 |
| KR | 10-2012-0027299 | 3/2012 |
| WO | 2005065385 | 7/2005 |
| WO | 2006027739 | 3/2006 |
| WO | 2007002857 | 1/2007 |
| WO | 2010/132144 A1 | 11/2010 |
| WO | 2011050115 | 4/2011 |

OTHER PUBLICATIONS

Hattori, et al.; Design of a 200V Super Junction MOSFET with N-Buffer Regions and its Fabrication by Trench Filling; Proceedings of 2004 International Symposium on Power Semiconductor Devices & ICS, Kitakyushu; 2004.

Session I, Boston, MA, Dec. 1, 1986, Lawrence Berkeley Laboratory Jniversity of California, Berkeley, California, LBL-22577.

Y. C. Pao et al., "(110)-Oriented GaAs MESFET's", IEEE Electron Device Letters, vol. 9, No. 3, pp. 119-121, Mar. 1988.

Masakatsu Hoshi et al., "A DMOSFET Having a Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

Takemura et al., "BSA Technology for Sub-100nm Deep Base Bipolar Transistors", Int'l Elec. Devs. Meeting, 1987, pp. 375-378. Jan.

S.C. Sun et al., "Modeling of the On-Resistance of LDMOS, VDMOS, and VMOS Power Transistors", IEEE Trans. Electron Devices, vol. ED-27, No. 2, Feb. 1980, pp. 356-367.

P. Ou-Yang, "Double Ion Implanted V-MOS Technology", IEEE Journal of Solid State Circuits, vol. SC-12, No. 1, Feb. 1977, pp. 3-10.

D. Jaume et al, "High-Voltage Planar Devices Using Field Plate and Semi-Resistive Layers", IEEE Trans. on Electron Devices, vol. 38, No. 7, Jul. 1991, pp. 1681-1684.

Baliga, "Modern Power Devices", A Wiley-Interscience Publication, John Wiley & Sons, Inc., 1987, pp. 62-131.

Barbuscia et al., "Modeling of Polysilicon Dopant Diffusion for Shallow-Junction Bipolar Technology", IEDM, 1984, pp. 757-760, No Month.

K. Shenai et al., "Optimum Low-Voltage Silicon Power Switches Fabricated Using Scaled Trench MOS Technologies", IEEE, International Electron Devices Meeting, Dec. 9, 1990, San Francisco, USA, pp. 793-797.

Deboy et al., "A new generation of high voltage MOSFETs breaks the limit line of silicon," IEDM '98, Technical Digest, International, Dec. 1998, pp. 683-685, IEEE.

Lorenz et al., "COOLMOS(TM)—a new milestone in high voltage Power MOS," Proceedings of the 11th International Symposium on Power Semiconductor Devices & ICs, 1999, pp. 3-10, IEEE.

Saito et al., "A 20 mΩ • cm2 600V-class Superjunction MOSFET," Proceedings of 2004 International Symposium on Power Semiconductor Devices & ICs, pp. 459-462.

Iwamoto et al., "Above 500V class Superjunction MOSFETs fabricated by deep trench etching and epitaxial growth," Proceedings of the 17th International Symposium on Power Semiconductor Devices & ICs, May 23-26, 2005, pp. 31-34, IEEE.

Kim et al.,"New Power Device Figure of Merit for High-Frequency Applications," Proceedings of 1995 International Symposium on Power Semiconductor Devices & ICs, pp. 309-314.

Antoniu et al., "Towards Achieving the Soft-Punch-Through Superjunction Insulated-Gate Bipolar Transistor Breakdown Capability," IEEE Electron Device Letters, vol. 32, No. 9, Sep. 2011, pp. 1275-1277.

Shenoy et al., "Analysis of the Effect of Charge Imbalance on the Static and Dynamic Characteristics of the Superjunction MOSFET," Proceedings of the 11th International Symposium on Power Semiconductor Devices & ICs, 1999, pp. 99-102, IEEE.

A. Q. Huang, "New Unipolar Switching Power Device Figures of Merit," IEEE Electron Device Letters, vol. 25, No. 5, May 2004, pp. 298-301.

Antognetti, "Power Integrated Circuits: Physics, Design, and Applications," McGraw-Hill Book Co., 1986, pp. 3.14-3.27, Dec.

"SMP60N06, 60N05, SMP50N06, 50N05, N-Channel Enhancement Mode Transistors," MOSPOWER Data Book, Siliconix inc., 1988, pp. 4-423-4-426.

Chang et al., "Vertical FET Random-Access Memories With Deep Trench Isolation," IBM Technical Disclosure Bulletin, vol. 22, No. 8B, Jan. 1980, pp. 3683-3687.

Patent Application As Filed for U.S. Appl. No. 14/663,872; Inventors: Misbah Ul Azam et al.; filed Mar. 20, 2015; "MOSFET Termination Trench,".

\* cited by examiner

ADAPTIVE CHARGE BALANCED EDGE TERMINATION

CROSS-REFERENCE TO RELATED APPLICATION

This is a divisional application of U.S. patent application Ser. No. 13/484,114, now U.S. Pat. No. 9,842,911, entitled "Adaptive Charge Balanced Edge Termination", by Naveen Tipirneni et al., filed May 30, 2012, which is hereby incorporated by reference.

BACKGROUND

There are different types of edge termination structures used to increase the breakdown voltage of P-N junctions in semiconductor devices such as diodes, metal-oxide semiconductor field-effect transistor (MOSFET) devices, insulated-gate bipolar transistor (IGBT) devices, bipolar junction transistor (BJT) devices, and the like. Various edge termination structures have been developed including, for example, field plate structures, field limiting rings with or without field plates, junction termination extension (JTE) and its variants. However, it is desirable to develop an edge termination structure utilizing as small a width as possible to achieve ideal planar breakdown voltages on given P-N junctions.

SUMMARY

Various embodiments in accordance with the invention provide efficient, manufacturable, and robust edge termination techniques utilizing a smaller width that are able to achieve ideal planar breakdown voltages on given P-N junctions.

In one embodiment, a semiconductor device can include a substrate including a first type dopant. The semiconductor device can also include an epitaxial layer located above the substrate and including a lower concentration of the first type dopant than the substrate. In addition, the semiconductor device can include a junction extension region located within the epitaxial layer and including a second type dopant. Furthermore, the semiconductor device can include a set of isolated narrow and shallow field rings in physical contact with the junction extension region and including a higher concentration of the second type dopant than the junction extension region. Moreover, the semiconductor device can include an edge termination structure in physical contact with the set of field rings.

In another embodiment, a method can include generating a junction extension region within an upper surface of an epitaxial layer of a semiconductor device. The epitaxial layer can include a first type dopant and the junction extension region can include a second type dopant. Furthermore, the method can include generating a set of isolated narrow and shallow field rings in physical contact with the junction extension region and including a higher concentration of the second type dopant than the junction extension region. Additionally, the method can include generating an edge termination structure in physical contact with the set of field rings.

In yet another embodiment, a metal oxide semiconductor field effect transistor (MOSFET) device can include a substrate including a first type dopant. Also, the MOSFET device can include an epitaxial layer located above the substrate and including a lower concentration of the first type dopant than the substrate. Moreover, the MOSFET device can include a junction extension region located within the epitaxial layer and including a second type dopant. Additionally, the MOSFET device can include a set of isolated narrow and shallow field rings in physical contact with the junction extension region and including a higher concentration of the second type dopant than the junction extension region. Furthermore, the MOSFET device can include an edge termination structure in physical contact with the set of field rings.

While particular embodiments in accordance with the invention have been specifically described within this Summary, it is noted that the invention and the claimed subject matter are not limited in any way by these embodiments.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings.

Figure 1:
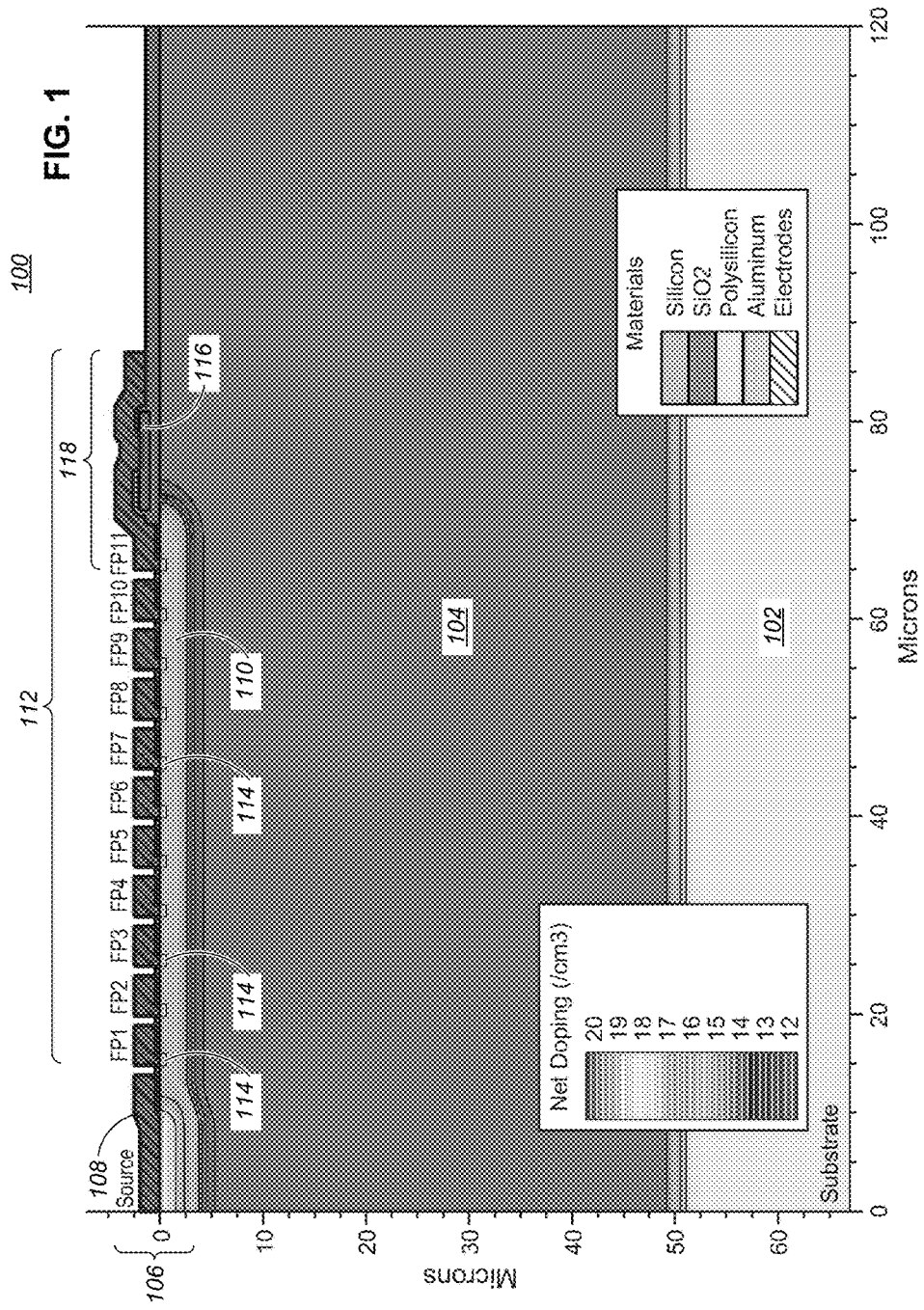
FIG. 1 is a side sectional view of an adaptive charge balanced edge termination of a semiconductor device in accordance with various embodiments of the invention.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "generating," "creating," "forming," "performing," "producing," "depositing," "etching", "defining", "removing" or the like, refer to actions and processes of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the invention can be implemented in conjunction with these other (perhaps conventional) processes and steps without significantly perturbing them. Generally speaking, embodiments in accordance with the invention can replace portions of a conventional process without significantly affecting peripheral processes and steps.

As used herein, the letter "N" refers to an N-type dopant and the letter "P" refers to a P-type dopant. A plus sign "+" or a minus sign "−" is used to represent, respectively, a relatively high or relatively low concentration of the dopant.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. Note that some of the figures are discussed in the context of an n-channel device, specifically an n-channel MOSFET. However, embodiments in accordance with the invention are not so limited. The discussion of the figures can be readily mapped to a p-channel device by substituting n-type dopant and materials for corresponding p-type dopant and materials, and vice versa.

FIG. 1 is a side sectional view of an adaptive charge balanced edge termination area 106 of a semiconductor device 100 in accordance with various embodiments of the invention. With the present embodiment, the adaptive charge balanced edge termination area 106 includes the main P-N junction of the semiconductor device 100 being terminated along with a P type junction extension region 110 at the surface of the semiconductor device 100. In an embodiment, the junction extension region 110 includes laterally varying dopant wherein the doping is more intense closer to source metal 108 and gradually decreases in doping intensity further away from the source metal 108. Within one embodiment, the junction extension region 110 can include highly doped P field rings 114 which are used to form an ohmic contact between the silicon and multiple field plates 112. In an embodiment, the field rings 114 can be implemented as isolated, narrow, and shallow field rings 114. In one embodiment, the semiconductor device 100 can include an N+ substrate 102, an N− doped epitaxial region 104, source metal 108, and the adaptive charge balanced edge termination area 106. In an embodiment, the junction extension region 110 is terminated by a polysilicon and metal field plate 118, which further extends the breakdown voltage due to the traditional field plate action (e.g., depletion from the MOS section consisting of the field plate and the isolation dielectric and the silicon epitaxial region). In an embodiment, the thickness of the isolation dielectric is chosen according to the differential breakdown voltage between the drain potential and the field plate potential. It is pointed out that the polysilicon and metal field plate 118 of the present embodiment includes a polysilicon field plate 116. Note that in an embodiment, the N+ substrate 102 and the N− doped epitaxial region 104 can collectively be referred to as a substrate, but are not limited to such. A channel stop region is described in detail later (e.g., FIG. 10) and is not shown here.

Within the present embodiment, the junction extension region 110 excluding the specially confined highly P type doped ohmic field rings 114 can include a total charge per unit area which is about 10%-70% of the charge value at which conventional JTE (e.g., within FIG. 2) or JTE variants achieves highest breakdown voltage or charge balance conditions. It is noted that in the semiconductor device 100, under reverse bias conditions, the charge in junction extension region 110 excluding ohmic field rings 114 depletes at a certain cathode voltage which depends on the depleted charge in the region and at a voltage that is small compared to the breakdown voltage of the P-N junction of the semiconductor device 100. Once the junction extension region 110 is depleted, the field plates 112 connected to the silicon through ohmic field rings 114 float to different voltages depending on the potential distribution in the depleted P type junction extension region 110. Note that the field plates 112 located closer to the cathode potential side at the surface float to a higher potential. In addition, the field plates 112 located closer to the anode potential side at the surface float to a lower potential. The field plates 112 which float to negative potentials with respect to cathode potential aid in depleting the N type silicon and hence mitigating the electric fields experienced by the main P-N junction and its extension area 110.

Within FIG. 1, the P+ field rings 114 in an embodiment are able to force another distribution of the potential in addition to the potential distribution that occurs without the P+ field rings 114. Furthermore, in one embodiment, the adaptive charge balanced edge termination area 106 is adapting the potential drop in silicon within its field plates structures 112 located on the top of the silicon. Specifically, each of the field plates 112 includes metal that has a constant potential. Additionally, each of these metals of the field plates 112 has a similar potential that can force an electric field on top of the silicon of the semiconductor device 100.

It is pointed out that in an embodiment the adaptive charge balanced edge termination area 106 can be very efficient in terms of the space (or area) used to achieve breakdown voltages close to ideal value. For example in one embodiment, by utilizing the adaptive charge balanced edge termination area 106, the P-N junction semiconductor device 100 when designed for 660 volts (V) operation can be effectively terminated using less than 110 microns (or micrometers) of silicon surface of the semiconductor device 100. In addition, the adaptive charge balanced edge termination area 106 has a wide margin for manufacturing variations when compared with a conventional junction termination extension structure (e.g., FIG. 2).

Within FIG. 1, note that the semiconductor device 100 can be implemented in a wide variety of ways. For example, in various embodiments, the semiconductor 100 can be implemented as, but is not limited to, a diode, a metal-oxide semiconductor field-effect transistor (MOSFET), an insulated-gate bipolar transistor (IGBT), a bipolar junction transistor (BJT), and the like. In addition, in various embodiments, the adaptive charge balanced edge termination area 106 of the semiconductor device 100 can include a greater or lesser number of field plates than the field plates 112 shown within FIG. 1. Furthermore, in one embodiment, a passivation layer (not shown) can be deposited above the source metal 108, the field plate structures 112, and any other structures and upper surfaces of the semiconductor device 100. Moreover, in an embodiment, a layer of polyimide (not shown) can be deposited over the source metal 108, the field plate structures 112, and any other structures and upper surfaces of the semiconductor device 100. In an embodiment, the junction extension region 110 can be implemented as P− junction extension region 110, but is not limited to such. In one embodiment, the doping concentration of the P− junction termination extension region 110 can be substantially lower than that of a conventional single zone JTE (e.g., 206 of FIG. 2) for silicon. For example, in an embodiment, the doping concentration of the P− junction extension region 110 can be, but is not limited to, of the order of approximately $1 \times 10^{11}/cm^3$ while the doping concentration of a conventional single zone JTE is $1 \times 10^{12}/cm^3$ for silicon.

It is pointed out that FIG. 1 includes both an X-axis and Y-axis that illustrate the cross sectional size of the semiconductor device 100. Specifically, the X-axis of FIG. 1 includes a micron (or micrometer) scale while the Y-axis includes a micron (or micrometer) scale.

Note that the semiconductor device 100 may not include all of the elements illustrated by FIG. 1. Additionally, the semiconductor device 100 can be implemented to include one or more elements not illustrated by FIG. 1. It is pointed out that the semiconductor device 100 can be utilized or implemented in any manner similar to that described herein, but is not limited to such.

Figure 2:
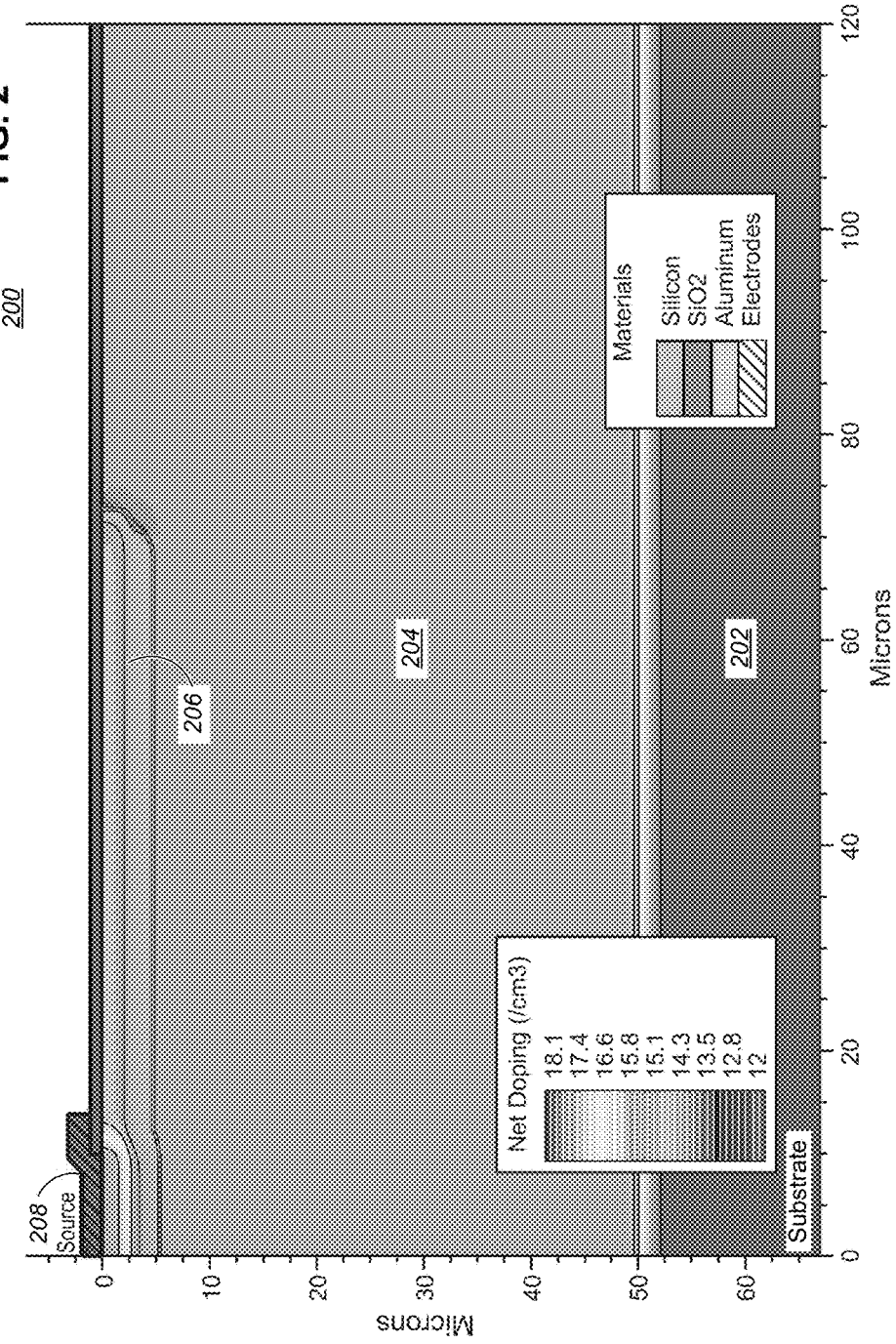
FIG. 2 is side sectional view of a conventional single zone junction termination extension (JTE).

FIG. 2 is side sectional view of a conventional single zone junction termination extension (JTE) 206 of a semiconductor device 200. It is pointed out that the single zone junction termination extension 202 is included herein to illustrate the advantages of various embodiments in accordance with the invention. The semiconductor device 200 includes a substrate 202, an epitaxial region 204, the junction termination extension 206, and a source metal 108. It is noted that the junction termination extension 206 is fabricated within the epitaxial region 204 and includes laterally varying doping. Specifically, the doping of the junction termination extension 206 is more intense closer to the source metal 208 and gradually decreases in doping intensity further away from the source metal 108.

Figure 3:
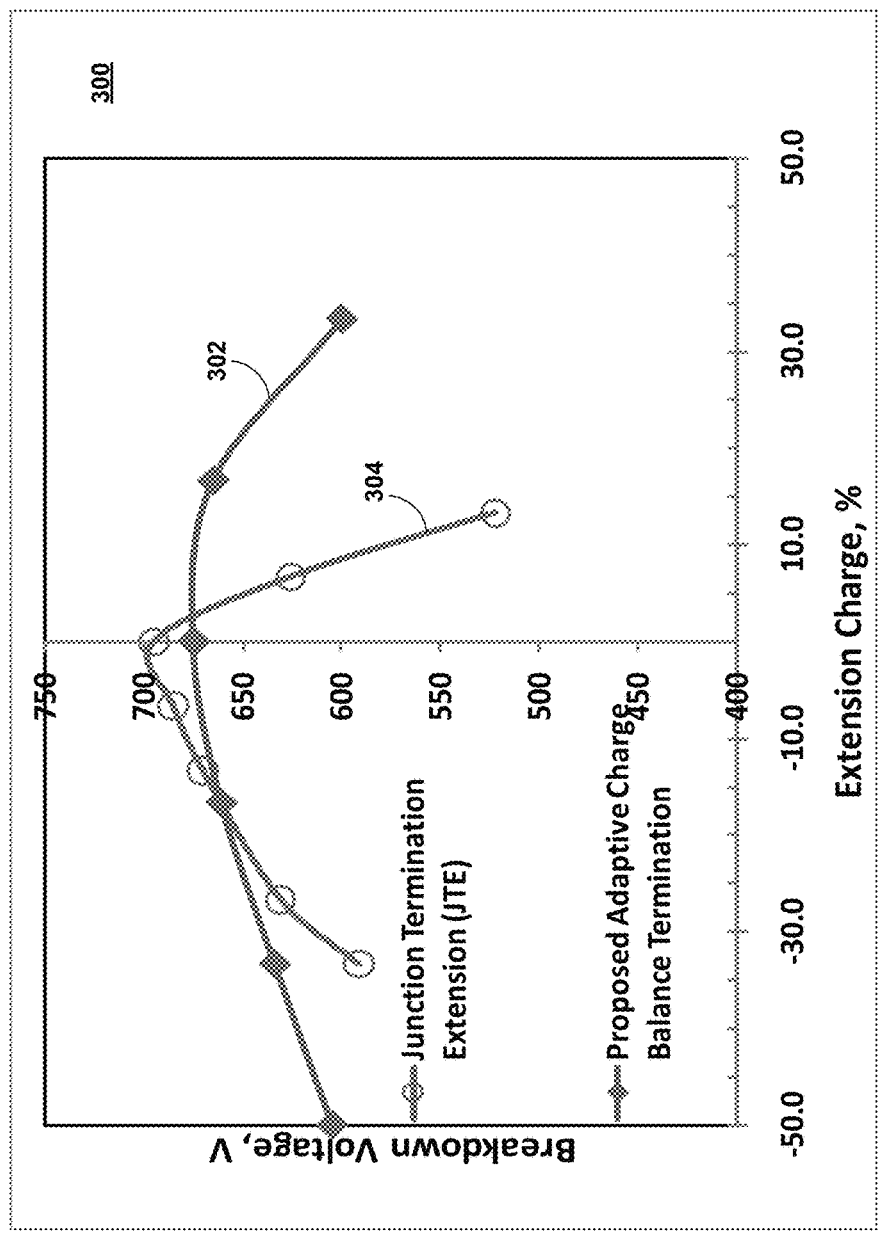
FIG. 3 is a graph comparing breakdown voltage sensitivity to charge variation in a conventional JTE and an adaptive charge balanced edge termination in accordance with various embodiments of the invention.

FIG. 3 is a graph 300 illustrating a comparison of breakdown voltage sensitivity to charge variation in the junction extension region 110 of the adaptive charge balanced edge termination structure 106 in accordance with an embodiment of the invention and the conventional junction termination extension 206. It is pointed out that the Y-axis of the graph 300 represents the breakdown voltage (V) while the X-axis of the graph 300 represents the extension charge variation by percent (%). Furthermore, curve 302 of the graph 300 represents the breakdown voltage sensitivity to charge variation in the junction extension region 110 of the adaptive charge balanced edge termination structure 106. In addition, curve 304 of the graph 300 represents the breakdown voltage sensitivity to charge variation in the conventional junction termination extension 206.

Within graph 300, it is pointed out that the curve 302 representing the adaptive charge balanced edge termination structure 106 has a much smoother curve than the curve 304 representing the conventional junction termination extension 206. Moreover, note that the curve 302 does not include the sharp drop exhibited by the curve 304 from zero to approximately 14% charge variation. Therefore, the adaptive charge balanced edge termination structure 106 produces better breakdown voltage sensitivity to charge variation.

Figure 4:
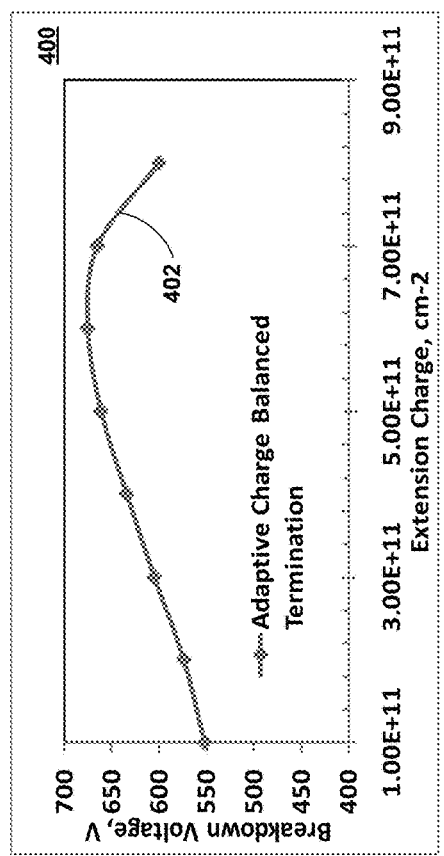
FIG. 4 illustrates the dependence of breakdown voltage on a junction extension charge for an adaptive charge balanced edge termination in accordance with various embodiments of the invention.
Figure 5:
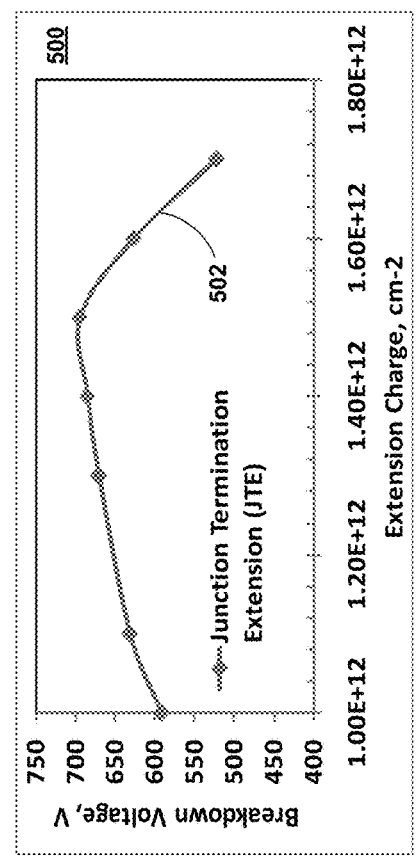
FIG. 5 illustrates the dependence of breakdown voltage on a junction extension charge for a single zone junction termination extension.

FIGS. 4 and 5 will be described and compared to demonstrate that the adaptive charge balanced edge termination structure 106 in accordance with an embodiment of the invention performs better than the conventional single zone junction termination extension 206.

FIG. 4 is a graph 400 illustrating the dependence of breakdown voltage on a junction extension charge for an adaptive charge balanced edge termination structure (e.g., 106) in accordance with various embodiments of the invention. Note that the Y-axis of the graph 400 represents the breakdown voltage (V) while the X-axis of the graph 400 represents the extension charge (/cm$^2$). Additionally, curve 402 of the graph 400 represents the dependence of breakdown voltage on a junction extension charge for the adaptive charge balanced edge termination structure 106.

FIG. 5 is a graph 500 illustrating the dependence of breakdown voltage on a junction extension charge for a conventional single zone junction termination extension (e.g., 206). It is noted that the Y-axis of the graph 500 represents the breakdown voltage (V) while the X-axis of the graph 500 represents the extension charge (/cm$^2$). Furthermore, curve 502 of the graph 500 represents the dependence of breakdown voltage on a junction extension charge for the conventional single zone junction termination extension 206.

Note that the adaptive charge balanced edge termination curve 402 of the graph 400 is a flatter curve than the junction termination extension curve 502 of the graph 500. Therefore, the adaptive charge balanced edge termination structure 106 performs better than the conventional single zone junction termination extension 206. Moreover, it is noted that the lowest extension charge value shown within the graph 400 is an order of magnitude less than the lowest extension charge value shown with the graph 500. As such, the adaptive charge balanced edge termination structure 106 performs better than the conventional single zone junction termination extension 206.

FIGS. 6-10 illustrate a process for fabricating an adaptive charge balanced edge termination of a semiconductor device in accordance with various embodiments of the invention. In one embodiment, the semiconductor device of FIG. 6-10 can include, but is not limited to, a 600 V MOSFET with an adaptive charge balanced edge termination.

Figure 6:
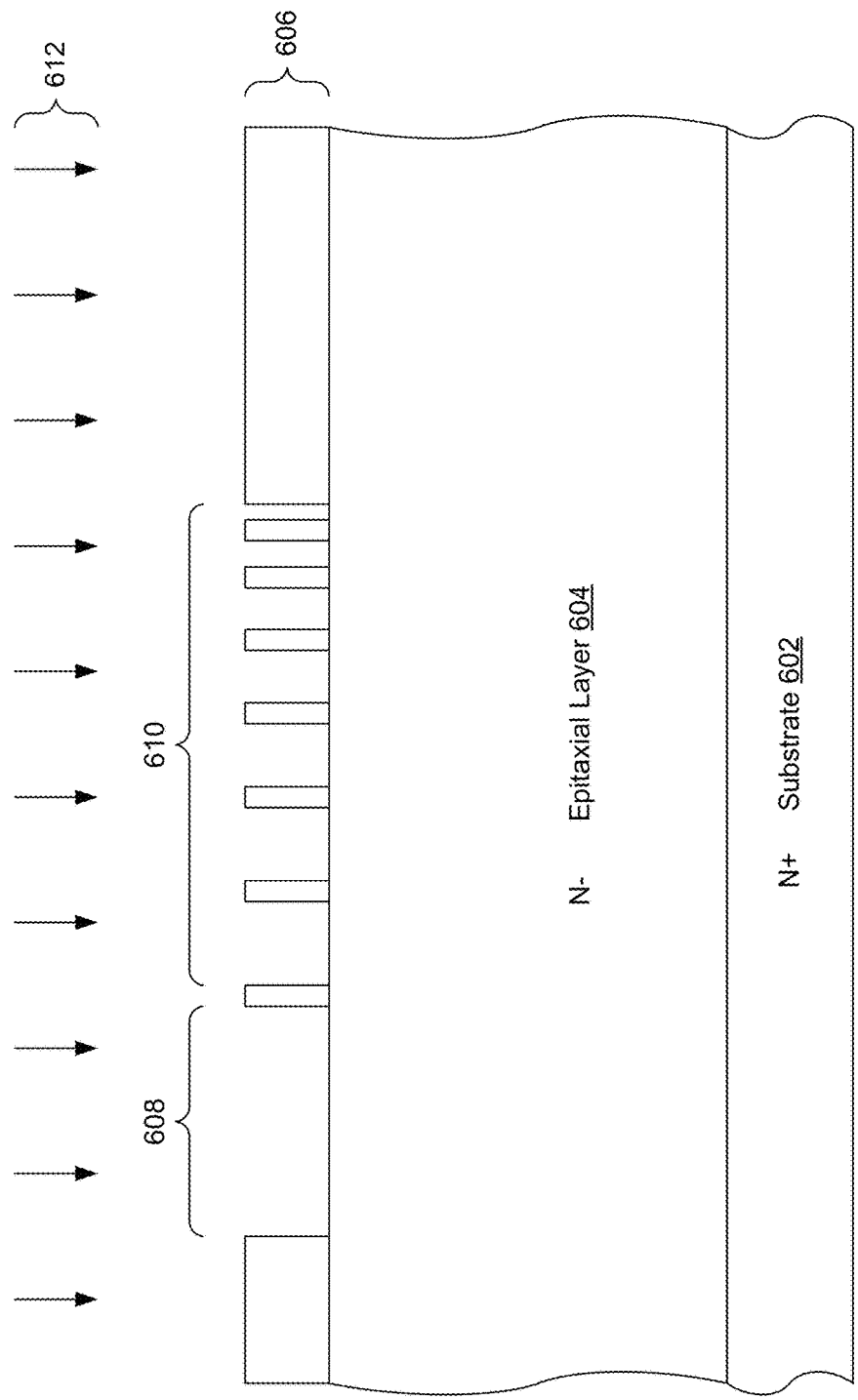
FIGS. 6-10 illustrate a process for fabricating an adaptive charge balanced edge termination of a semiconductor device in accordance with various embodiments of the invention.

FIG. 6 illustrates a side sectional view of an extension ring mask or junction extension region mask 606 in accordance with an embodiment of the invention deposited (or located) on an N− doped epitaxial layer 604, which is formed above an N+ substrate 602. It is noted that in one embodiment, the N+ substrate 602 and the N− doped epitaxial layer 604 can collectively be referred to as a substrate, but are not limited to such.

More specifically, in an embodiment, the junction extension mask 606 can include a larger opening 608 for forming a P type tub region within the N– doped epitaxial layer 604. In addition, the junction extension mask 606 can include a grated mask region 610 which has openings designed so that the desired amount of doped charge is incorporated within the N– doped epitaxial layer 604 to form a P junction extension region for termination using a single high doped boron implantation 612, but is not limited to such. It is pointed out that wherever there are openings within the junction extension mask 606, the boron 612 is able to pass through the openings and into the N– doped epitaxial layer 604. Furthermore, the openings of the grated mask region 610 are designed in such a manner that once the boron 612 is incorporated in the N– doped epitaxial layer 604, the boron 612 will eventually overlap after a thermal drive-in. Additionally, in an embodiment, the openings of the grated mask region 610 are designed to form the P junction extension region for termination having laterally varying dopant wherein the doping is more intense closer to the larger opening 608 and gradually decreases in doping intensity further away from the larger opening 608. In one embodiment, the openings of the grated mask region 610 are larger closer to the larger opening 608 and gradually get smaller further away from the larger opening 608.

Figure 7:
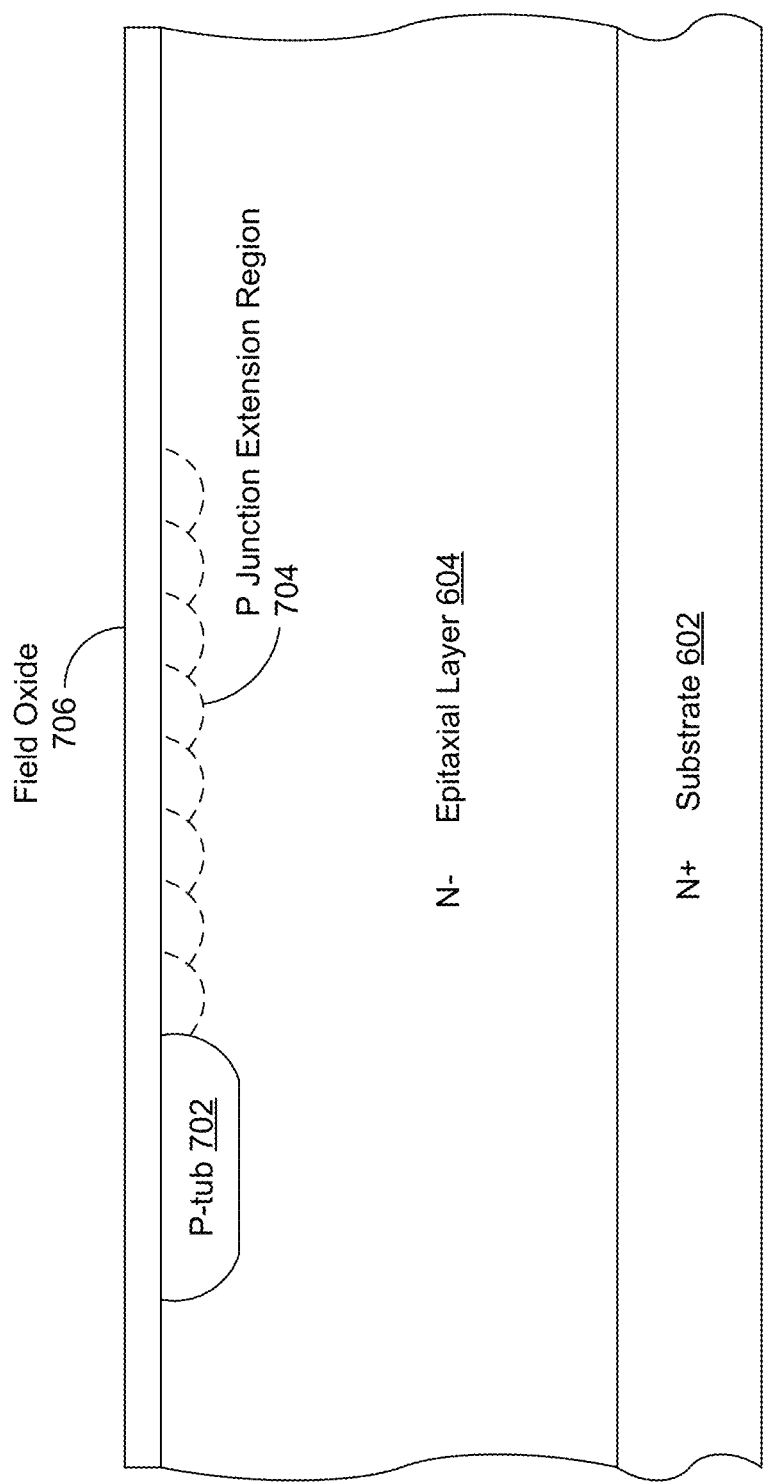

After the implantation of boron 612 within the N– doped epitaxial layer 604, FIG. 7 illustrates a thermal charge drive-in of boron 612 within the N– doped epitaxial layer 604 in accordance with various embodiments of the invention. In this manner, a P-tub 702 and a P junction termination extension region 704 are fabricated or formed within the N– doped epitaxial layer 604. It is pointed out that the thermal charge drive-in causes the implanted boron 612 to diffuse and overlap within the N– doped epitaxial layer 604. In addition, after the thermal drive-in process, FIG. 7 illustrates that a field oxide 706 can be grown or deposited onto the N– doped epitaxial layer 604 in accordance with various embodiments of the invention. In an embodiment, the junction extension region 704 can be implemented as P– junction extension region 704, but is not limited to such. In one embodiment, the junction extension region 704 includes laterally varying dopant wherein the doping is more intense closer to the P-tub 702 and gradually decreases in doping intensity further away from the P-tub 702.

Figure 8:
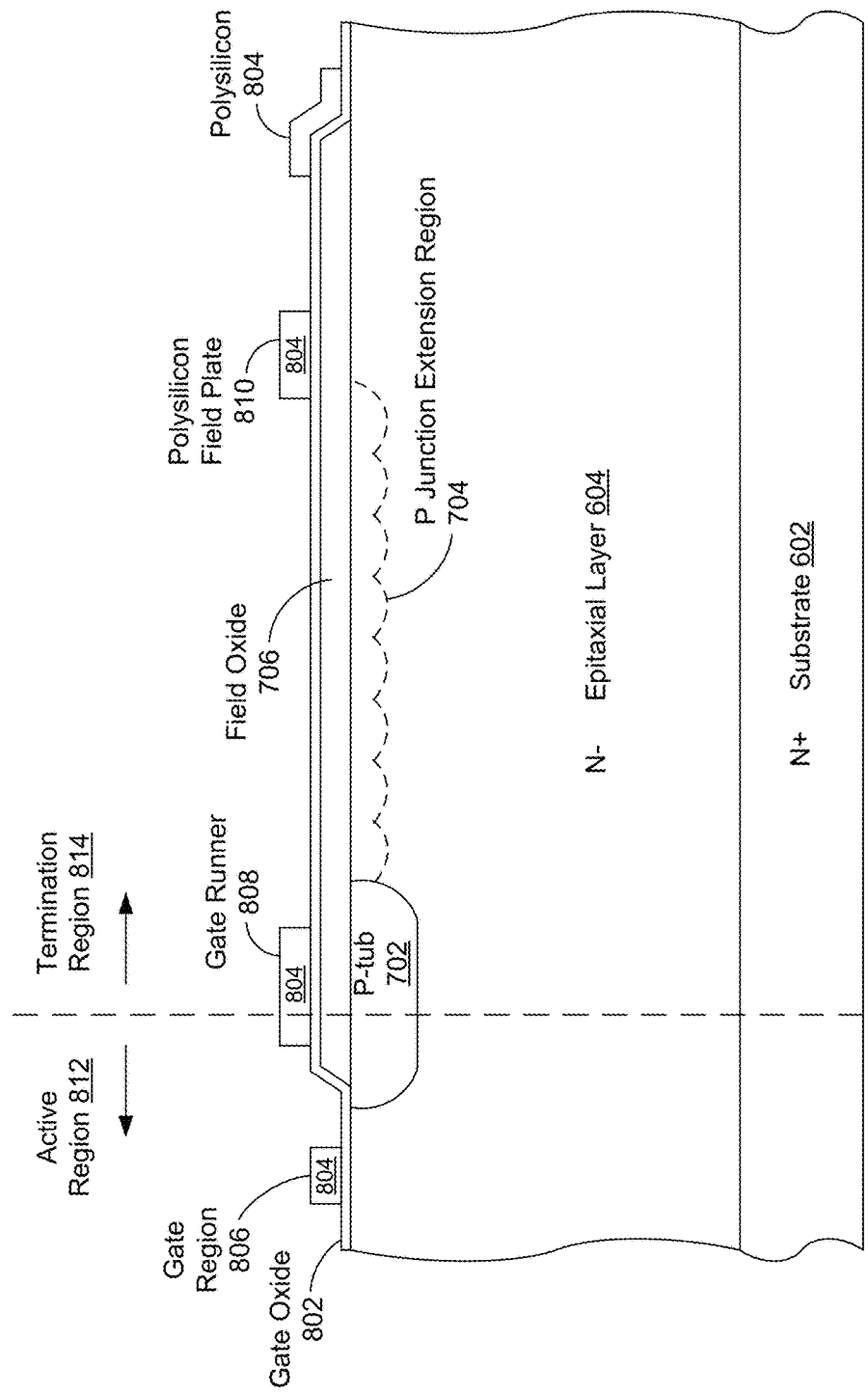

After fabricating the field oxide 706, FIG. 8 illustrates that an active mask layer can be utilized to etch off portions of the field oxide 706 thereby exposing the N– doped epitaxial layer 604. At that point, a gate oxide 802 can be grown on or above the top surfaces of the etched field oxide 706 and the N– doped epitaxial layer 604. After which, polysilicon 804 can be deposited on or above the top surfaces of the etched field oxide 706 and the N– doped epitaxial layer 604. Next, a mask can be utilized to etch or pattern away portions of polysilicon 804 resulting in the definition of a gate region 806, a gate runner 808, and a polysilicon field plate 810. It is pointed out that within FIG. 8, an active region 812 of the semiconductor device is on the left side of a vertical dash line while a termination region 814 of the semiconductor device is on the right side of the vertical dash line.

Figure 9:
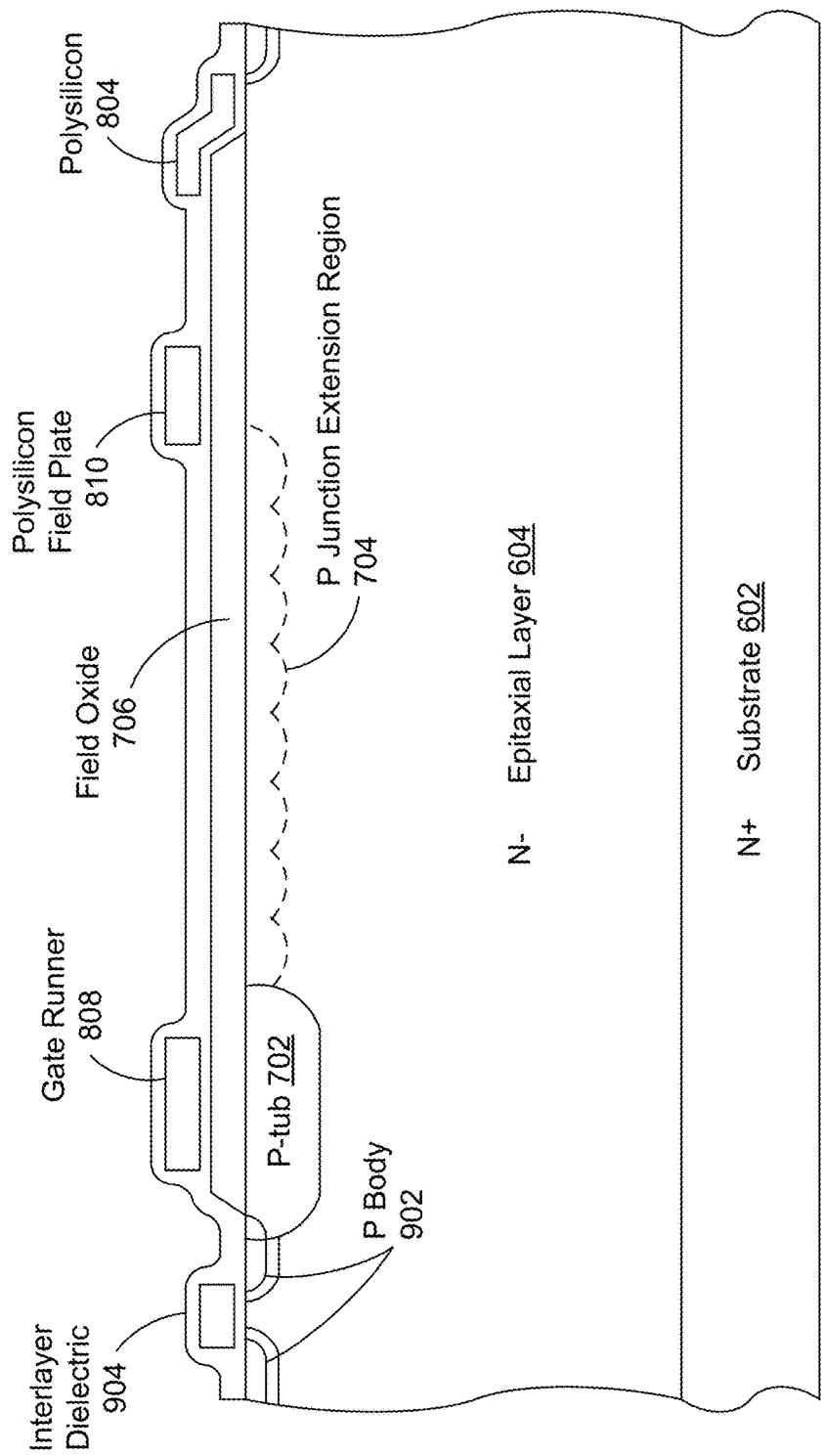

FIG. 9 illustrates body implant within the N– doped epitaxial layer 604, a thermal drive-in, followed by source N+ arsenic and shallow P+ implant resulting in P body 902 in accordance with various embodiments of the invention. Next, a deposition of an interlayer dielectric 904 can be deposited on or over the gate oxide 802 (not shown), the gate runner polysilicon 808, the polysilicon field plate 810, the polysilicon 804, and other upper surfaces of the semiconductor device of FIG. 9.

Figure 10:
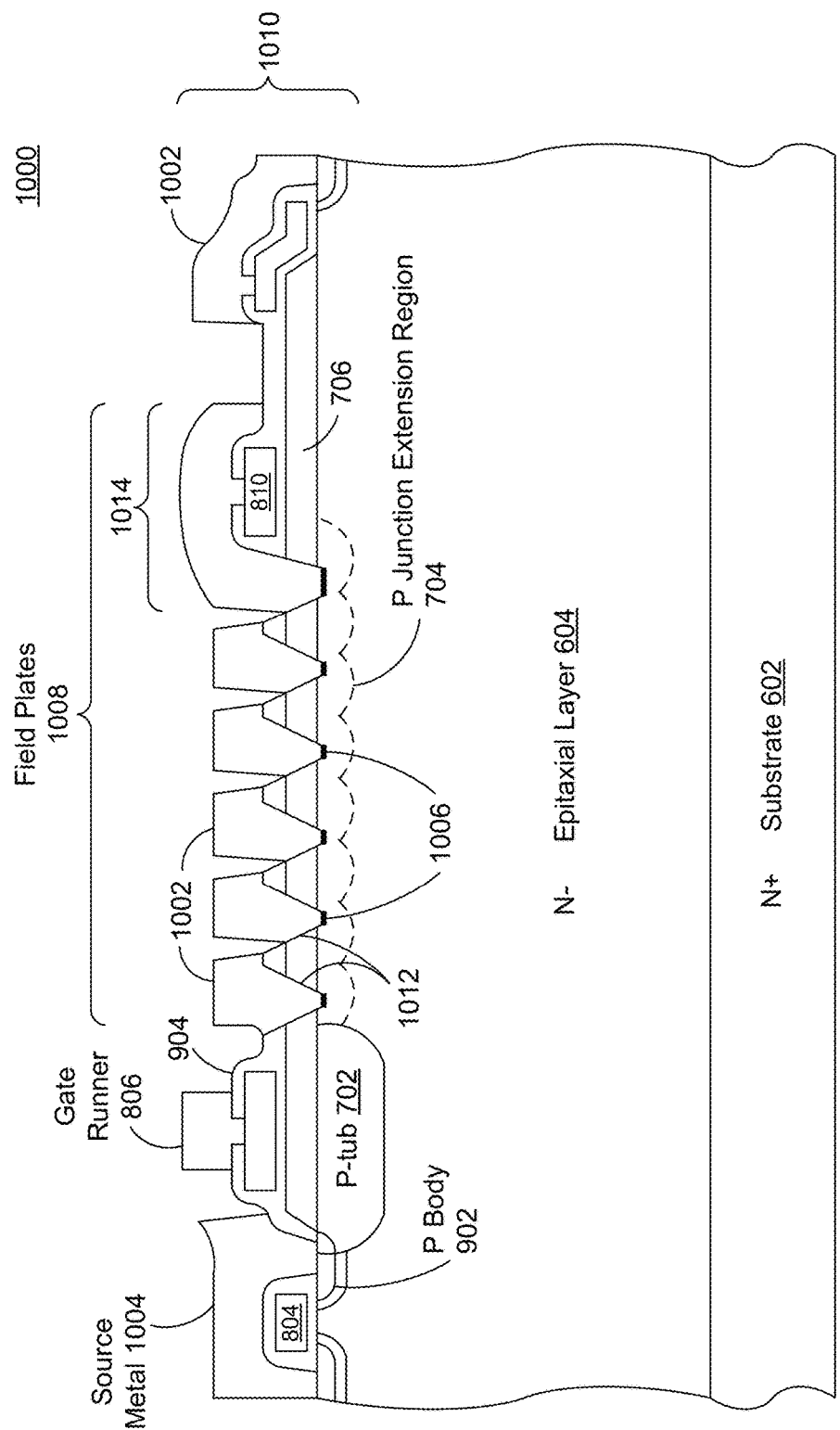

FIG. 10 illustrates a contact mask can be utilized to contact etch regions (or cavities or holes or trenches) 1012 that extend through the interlayer dielectric 904, the field oxide 706, and into the P junction extension region 704. Next, a shallow boron implant 1006, but not limited to, P+ doped polysilicon (or boron doped polysilicon) can be performed into the P junction extension region 704 at the bottom of each contact cavity 1012. Note that these implantations can be referred to as field rings 1006, which may be isolated, narrow, and shallow. After which, a layer of metal 1002 can be deposited above or over the semiconductor device 1000 and into the contact cavities 1012. Next, the metal 1002 can be etched to fabricate and make independent the source metal 1004, the gate runner 806, field plate structures 1008, and a metal and polysilicon field plate structure 1014. In this manner, the field plate structures 1008 and the metal and polysilicon field plate structure 1014 are in ohmic contact with the P junction extension region 704, but are not limited to such. For example, in one embodiment, the field plate structures 1008 and the metal and polysilicon field plate structure 1014 can be implemented such they are in Schottky contact with the P junction extension region 704. Note that in an embodiment the Schottky contact basically has a barrier between the contact and the silicon, and that is with a depletion layer (not shown). In one embodiment, it is noted that the metal and polysilicon field plate structure 1014 includes the polysilicon field plate 810.

It is pointed out that in one embodiment, the adaptive charge balanced edge termination 1010 can include, but is not limited to, the P junction extension region 704, the field plate structures 1008, the metal and polysilicon field plate structure 1014, the polysilicon field plate 810, and the gate runner 806. In an embodiment, a layer of polyimide (not shown) can be deposited above and over the source metal 1004, metal 1002, the gate runner 806, the field plate structures 1008, the metal and polysilicon field plate structure 1014, and any other structures and upper surfaces of the semiconductor device 1000. In one embodiment, a passivation layer (not shown) can be deposited above and over the source metal 1004, metal 1002, the gate runner 806, the field plate structures 1008, the metal and polysilicon field plate structure 1014, and any other structures and upper surfaces of the semiconductor device 1000.

Within FIG. 10, it is understood that a greater or lesser number of field plate structures 1008 can be implemented within the adaptive charge balanced edge termination 1010 of the semiconductor device 1000 than the five field plate structures 1008 shown. For example, in various embodiments, the semiconductor device 1000 can be implemented with, but not limited to, a set of metal and polysilicon field plates 1014, a set of metal field plates 1008, and/or a set of polysilicon field plates 810. In one embodiment, the number of field plates structures 1008 implemented within the adaptive charge balanced edge termination 1010 of the semiconductor device 1000 can depend on the voltage of the semiconductor device 1000 and the physical limits of the lithography equipment being utilized to fabricate the semiconductor device 1000. In an embodiment, note that the minimum achievable distance between the metal contacts of the field plate structures 1008 can be related to the critical field of the silicon of the semiconductor device 1000. In various embodiments, the gap distance or size located between each of the field plate structures 1008 can be similar to other gap distances or can be different or can be a mixture of similar and different distances. For example in various embodiments, the gap distance or size between two field plate structures (e.g., 1008) can be implemented as 2 microns, 3 microns, or a few microns, but is not limited to such.

Note that an adaptive charge balanced edge termination (e.g., 106 or 1010) of a semiconductor device (e.g., 100 or 1000) can be fabricated or implemented in accordance with various embodiments of the invention.

It is pointed out that the adaptive charge balanced edge termination 1010 and the semiconductor device 1000 may not include all of the elements illustrated by FIG. 10. Moreover, the adaptive charge balanced edge termination 1010 and the semiconductor device 1000 can each be implemented to include one or more elements not illustrated by FIG. 10. Note that the adaptive charge balanced edge termination 1010 and the semiconductor device 1000 can be utilized or implemented in any manner similar to that described herein, but is not limited to such.

Figure 11:
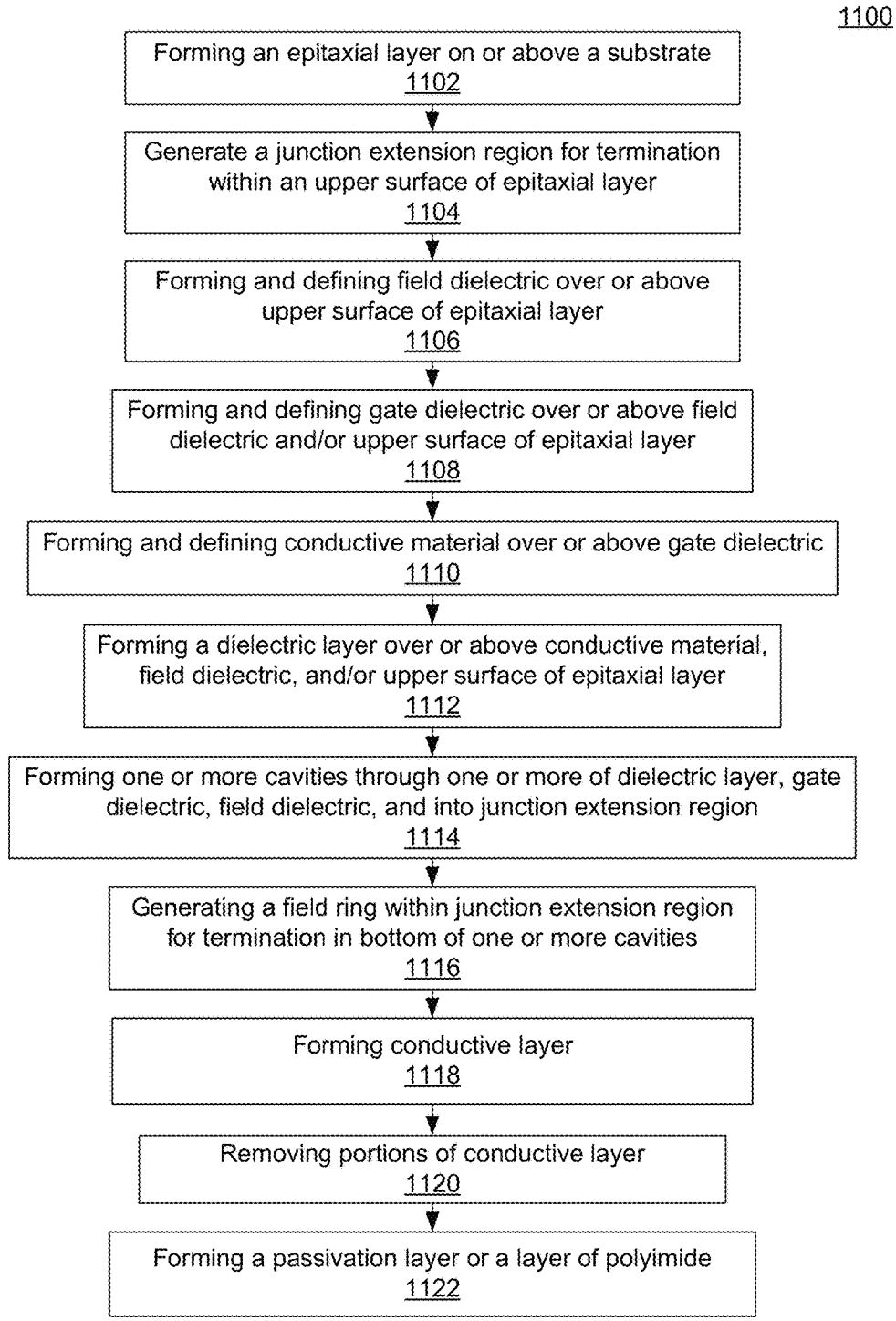
FIG. 11 is flow diagram of a method in accordance with various embodiments of the invention.

FIG. 11 is a flow diagram of a method 1100 for fabricating in accordance with various embodiments of the invention an adaptive charge balanced edge termination of a semiconductor device. Although specific operations are disclosed in FIG. 11, such operations are examples. The method 1100 may not include all of the operations illustrated by FIG. 11. Also, method 1100 may include various other operations and/or variations of the operations shown. Likewise, the sequence of the operations of flow diagram 1100 can be modified. It is appreciated that not all of the operations in flow diagram 1100 may be performed. In various embodiments, one or more of the operations of method 1100 can be controlled or managed by software, by firmware, by hardware or by any combination thereof, but is not limited to such. Method 1100 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

At operation 1102 of FIG. 11, an epitaxial layer (e.g., 604) can be formed on or above a substrate (e.g., 602). It is noted that operation 1102 can be implemented in a wide variety of ways. For example, in one embodiment the substrate at operation 1102 can include a first dopant while the epitaxial layer can include a lower concentration of the first dopant. Operation 1102 can be implemented in any manner similar to that described herein, but is not limited to such.

At operation 1104, a junction extension region (e.g., 704) for termination can be generated within an upper surface of the epitaxial layer. Note that operation 1104 can be implemented in a wide variety of ways. For example, in an embodiment the junction extension region for termination can include a second dopant. Operation 1104 can be implemented in any manner similar to that described herein, but is not limited to such.

At operation 1106 of FIG. 11, a field dielectric (e.g., 706) can be formed and defined over or above the upper surface of the epitaxial layer. It is pointed out that operation 1106 can be implemented in a wide variety of ways. For example, operation 1106 can be implemented in any manner similar to that described herein, but is not limited to such.

At operation 1108, gate dielectric (e.g., 802) can be formed and defined over or above field dielectric and/or the upper surface of the epitaxial layer. Note that operation 1108 can be implemented in a wide variety of ways. For example, operation 1108 can be implemented in any manner similar to that described herein, but is not limited to such.

At operation 1110 of FIG. 11, a conductive material (e.g., 804) can be formed and defined over or above gate dielectric. It is noted that operation 1110 can be implemented in a wide variety of ways. For example, operation 1110 can be implemented in any manner similar to that described herein, but is not limited to such.

At operation 1112, a dielectric layer (e.g., 904) can be formed over or above the conductive material, field dielectric, and/or the upper surface of the epitaxial layer. It is pointed out that operation 1112 can be implemented in a wide variety of ways. For example, operation 1112 can be implemented in any manner similar to that described herein, but is not limited to such.

At operation 1114 of FIG. 11, one or more cavities or holes (e.g., 1012) can be formed through one or more of the dielectric layer, gate dielectric, field dielectric, and into the junction extension region for termination. Note that operation 1114 can be implemented in a wide variety of ways. For example, operation 1114 can be implemented in any manner similar to that described herein, but is not limited to such.

At operation 1116, a field ring (e.g., 1006) can be generated within the junction extension region for termination in the bottom of the one or more cavities. It is noted that operation 1116 can be implemented in a wide variety of ways. For example, in one embodiment each contact region at operation 1116 can include a higher concentration of the second dopant. Operation 1116 can be implemented in any manner similar to that described herein, but is not limited to such.

At operation 1118 of FIG. 11, a conductive layer (e.g., 1002) can be formed over or above the one or more cavities, any dielectric layer, any conductive material, any field dielectric, and/or the upper surface of the epitaxial layer. It is pointed out that operation 1118 can be implemented in a wide variety of ways. For example, operation 1118 can be implemented in any manner similar to that described herein, but is not limited to such.

At operation 1120, one or more portions of the conductive layer can be removed such that the conductive layer within each of the one or more cavities does not physically contact conductive layer in another cavity. Note that operation 1120 can be implemented in a wide variety of ways. For example, operation 1120 can be implemented in any manner similar to that described herein, but is not limited to such.

At operation 1122 of FIG. 11, a passivation layer or a layer of polyimide can be formed over or above any conductive layer and/or the upper surface of the epitaxial layer. It is noted that operation 1122 can be implemented in a wide variety of ways. For example, operation 1122 can be implemented in any manner similar to that described herein, but is not limited to such. In this manner, an adaptive charge balanced edge termination of a semiconductor device can be fabricated in accordance with various embodiments of the invention.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A method comprising:
generating a junction extension region within an upper surface of an epitaxial layer of a semiconductor device, wherein said epitaxial layer comprising a first type dopant and said junction extension region comprising a second type dopant;
generating a field ring within said junction extension region and comprising a higher concentration of said second type dopant than said junction extension region; and
forming a field plate above and in physical contact with said field ring, said field plate comprises a metal and a polysilicon that are both located above and extend beyond said junction extension region,
wherein an edge termination of said semiconductor device comprises said junction extension region, said field ring, and said field plate.

2. The method of claim 1, further comprising:
forming a plurality of metal field plates, said edge termination comprises said plurality of metal field plates.

3. The method of claim 1, further comprising:
forming a plurality of polysilicon field plates, said edge termination comprises said plurality of polysilicon field plates.

4. The method of claim 1, wherein said junction extension region comprises laterally varying doping of said second type dopant.

5. The method of claim 1, wherein said field plate is in ohmic contact with said junction extension region.

6. The method of claim 1, further comprising:
forming a tub region within said epitaxial layer and comprising said second type dopant.

7. The method of claim 1, further comprising:
generating a plurality of field rings within said junction extension region, each of said plurality of field rings comprising a higher concentration of said second type dopant than said junction extension region, said edge termination comprises said plurality of field rings.

8. A method comprising:
generating a junction extension region within an upper surface of an epitaxial layer of a metal oxide semiconductor field effect transistor (MOSFET) device, wherein said epitaxial layer comprising a first type dopant and said junction extension region comprising a second type dopant;
generating a plurality of field rings within said junction extension region, each of said plurality of field rings comprising a higher concentration of said second type dopant than said junction extension region; and
forming a plurality of field plates, a field plate of said plurality of field plates is above and in physical contact with a field ring of said plurality of field rings, said field plate comprises a metal and a polysilicon that are both located above and extend beyond said junction extension region,
wherein an edge termination of said MOSFET device comprises said junction extension region, said plurality of field rings, and said plurality of field plates.

9. The method of claim 8, wherein each of said plurality of field plates comprises metal.

10. The method of claim 8, wherein each of said plurality of field plates comprises polysilicon.

11. The method of claim 8, wherein said junction extension region comprises laterally varying doping of said second type dopant.

12. The method of claim 8, further comprising:
forming a tub region within said epitaxial layer and comprising said second type dopant.

13. The method of claim 12, wherein said tub region in contact with and laterally adjacent to said junction extension region and extends deeper than said junction extension region.

14. The method of claim 8, wherein a second field plate of said plurality of field plates is above and in physical contact with a second field ring of said plurality of field rings.

15. A method comprising:
generating a junction extension region within an upper surface of an epitaxial layer of a semiconductor device, wherein said epitaxial layer comprising a first type dopant and said junction extension region comprising a second type dopant, said junction extension region comprises laterally varying doping of said second type dopant;
forming a tub region within said epitaxial layer and comprising said second type dopant;
generating a field ring within said junction extension region and comprising a higher concentration of said second type dopant than said junction extension region; and
forming a field plate above and in physical contact with said field ring, said field plate comprises a metal and a polysilicon that are both located above and extend beyond said junction extension region,
wherein an edge termination of said semiconductor device comprises said junction extension region, said field ring, and said field plate.

16. The method of claim 15, further comprising:
forming a plurality of metal field plates, said edge termination comprises said plurality of metal field plates.

17. The method of claim 15, further comprising:
forming a plurality of polysilicon field plates, said edge termination comprises said plurality of polysilicon field plates.

18. The method of claim 15, wherein said field plate is in ohmic contact with said junction extension region.

19. The method of claim 15, further comprising:
forming a plurality of field rings within said junction extension region and each comprising a higher concentration of said second type dopant than said junction extension region.

20. The method of claim 15, wherein said tub region contacts said junction extension region and extends deeper than said junction extension region.

* * * * *